(12) United States Patent
Cheon

(10) Patent No.: US 11,457,734 B2
(45) Date of Patent: Oct. 4, 2022

(54) FOLDABLE HOLDER

(71) Applicant: Myung Gon Cheon, Paju-si (KR)

(72) Inventor: Myung Gon Cheon, Paju-si (KR)

( * ) Notice: Subject to any disclaimer, the term of this patent is extended or adjusted under 35 U.S.C. 154(b) by 142 days.

(21) Appl. No.: 16/769,994

(22) PCT Filed: Nov. 12, 2018

(86) PCT No.: PCT/KR2018/013686
§ 371 (c)(1),
(2) Date: Apr. 20, 2021

(87) PCT Pub. No.: WO2019/117475
PCT Pub. Date: Jun. 20, 2019

(65) Prior Publication Data
US 2021/0298468 A1    Sep. 30, 2021

(30) Foreign Application Priority Data

Dec. 12, 2017    (KR) ........................ 10-2017-0170046

(51) Int. Cl.
*A47B 23/04*    (2006.01)
*A47B 23/06*    (2006.01)
(Continued)

(52) U.S. Cl.
CPC ............ *A47B 23/044* (2013.01); *A47B 23/06* (2013.01); *F16M 11/38* (2013.01); *G06F 1/166* (2013.01);
(Continued)

(58) Field of Classification Search
CPC ...... F16M 11/38; F16M 13/00; A47B 23/044; A47B 23/043; A47B 23/06;
(Continued)

(56) References Cited

U.S. PATENT DOCUMENTS

| 5,722,628 | A  | * | 3/1998 | Menaged | A47B 23/043 |
|           |    |   |        |         | 248/455     |
| 7,334,768 | B1 | * | 2/2008 | Lum     | A47B 23/04  |
|           |    |   |        |         | 248/444     |
| 7,367,539 | B2 | * | 5/2008 | Moss    | G09F 1/065  |
|           |    |   |        |         | 40/787      |
| 8,181,375 | B2 | * | 5/2012 | Tzuo    | G09F 1/06   |
|           |    |   |        |         | 248/173     |

(Continued)

FOREIGN PATENT DOCUMENTS

| KR | 200439159 Y1   | 3/2008  |
|----|----------------|---------|
| KR | 1020090118607 A | 11/2009 |

(Continued)

*Primary Examiner* — Ingrid M Weinhold

(57) ABSTRACT

An object of the present invention is to provide a foldable holder that is easy to carry. For this purpose, the foldable holder includes: a back surface support part configured to support the back surface of the object; a lower surface support part fastened to a lower end of the back surface support part, and configured to support a bottom surface of the object; and bottom support parts configured to support the back surface support part on a support surface at a set inclined angle; wherein the back surface support part includes a plurality of back support plates sequentially disposed from the bottom support part, and one or more connection hinges configured to rotatably connect the back support plates so that the back support plates are superimposed on each other.

3 Claims, 4 Drawing Sheets

(51) Int. Cl.
  *F16M 11/38* (2006.01)
  *G06F 1/16* (2006.01)
  *G06F 1/20* (2006.01)
  *H05K 7/20* (2006.01)

(52) U.S. Cl.
  CPC ......... *G06F 1/203* (2013.01); *H05K 7/20136* (2013.01); *A47B 2023/049* (2013.01)

(58) Field of Classification Search
  CPC ........... A47B 2023/049; A47B 2097/005–006; A47B 23/042; G06F 1/166; G06F 1/203; H05K 7/20136
  USPC ................. 248/464, 459, 460, 455–457, 688
  See application file for complete search history.

(56) References Cited

U.S. PATENT DOCUMENTS

| | | | |
|---|---|---|---|
| 8,360,384 B2* | 1/2013 | Farris-Gilbert | F16M 11/38 206/45.24 |
| D902,936 S* | 11/2020 | Hong | D14/447 |
| 2008/0029412 A1* | 2/2008 | Ho | F16M 11/10 361/679.55 |
| 2008/0037213 A1* | 2/2008 | Haren | G06F 1/1632 108/7 |

FOREIGN PATENT DOCUMENTS

| | | | |
|---|---|---|---|
| KR | 1020120008928 A | 2/2012 | |
| KR | 1020150059372 A | 6/2015 | |
| KR | 1020160088734 A | 7/2016 | |

\* cited by examiner

FOLDABLE HOLDER

CROSS REFERENCE TO RELATED APPLICATIONS

This application is a national entry application of International Application No. PCT/KR2018/013686 filed on Nov. 12, 2018, which claims priority to Korean Application No. 10-2017-0170046 filed on Dec. 12, 2017, the entire contents of which are herein incorporated by reference in its entirety.

TECHNICAL FIELD

The present invention relates to a foldable holder.

TECHNICAL BACKGROUND

In general, support holders may be basically classified into reading stands for supporting books and notebook supports for supporting notebook computers according to their object to be supported.

Such a support holder includes a back support plate configured to support the back surface of an object to be supported, a bottom support plate fastened to the lower end of the back support plate and configured to support the bottom surface of the object, and a lower surface support part configured to support the back support plate on a support surface at a set inclined angle.

However, the conventional support holder has a problem in that it is difficult to carry due to the size of the back support plate. In particular, since the size of the back support plate is designed to be larger than the size of an object to be supported, a problem arises in that the support holder cannot be accommodated in a bag designed to fit the size of the object to be supported.

DETAILED DESCRIPTION

Problems to be Solved

The present invention has been conceived to overcome the above-described problems, and an object of the present invention is to provide a foldable holder that is easy to carry.

Solution to Solve the Problem

In order to accomplish the above object, a foldable holder according to an embodiment of the present invention is a foldable holder for supporting an object to be supported, the foldable holder including: a back surface support part configured to support the back surface of the object; a lower surface support part fastened to a lower end of the back surface support part, and configured to support a bottom surface of the object; and bottom support parts configured to support the back surface support part on a support surface at a set inclined angle; wherein the back surface support part includes a plurality of back support plates sequentially disposed from the bottom support part, and one or more connection hinges configured to rotatably connect the back support plates so that the back support plates are superimposed on each other; wherein the plurality of back support plate includes first, second, third, and fourth back support plates sequentially disposed from the bottom support part; wherein the one or more connection hinges include first connection hinges configured to rotatably connect the first and second back support plates, second connection hinges configured to rotatably connect the second and third back support plates, and third connection hinges configured to rotatably connect the third and fourth back support plates; wherein the first, second, third, and fourth back support plates have the same size and shape; wherein the first and second back support plates are folded by the first connection hinges so that the front surfaces thereof come into contact with each other; wherein the second and third back support plates are folded by the second connection hinges so that the back surfaces thereof come into contact with each other; wherein the third and fourth back support plates are folded by the third connection hinges so that the front surfaces thereof come into contact with each other; wherein the left and right bottom supports each have a plate shape, and wherein when the first, second, third, and fourth back support plates are superimposed on each other, the Inclination maintaining portions are located on the back surface of the first back support plate, and the left and right bottom supports are pivoted under the lower surface support part.

The back surface support part may further include: a cooling fan provided on any one of the plurality of back support plates; and an auxiliary holder provided on another of the plurality of back support plates to be selectively extended and retracted in a front-back direction, and configured to seat a smartphone or tablet PC.

The cooling fan may be provided on the second back support plate.

The auxiliary holder may be provided on the third back support plate.

Each of the bottom support parts may include: a bottom support provided on the bottom surface of the lower surface support part to be laterally rotatable, and provided with a plurality of inclination adjusting grooves, formed in the longitudinal direction thereof, on the top surface thereof; and an inclination maintaining portion provided on the back surface of the back surface support part to be vertically rotatable, and configured to be caught on any one of the plurality of inclination adjusting grooves.

The boundary portion of the bottom support with respect to the lower surface support part may be made thin, and may be thus allowed to be easily bent when inclination is adjusted.

The object to be supported may be a book, a notebook computer, or a tablet PC.

The back surface support part may further include an external input terminal, a USB extension adaptor, and an auxiliary battery seat portion.

Advantages of Invention

As described above, the foldable holder according to an embodiment of the present invention may have the following effect:

According to the one embodiment of the present invention, the foldable holder includes the back surface support part, the bottom support part, and the bottom support parts. The back surface support part supports the back surface of an object to be supported, such as a book, a notebook computer or the like, and is configured to include the plurality of back support plates sequentially disposed from the lower surface support part and the one or more connection hinges configured to rotatably connect the back support plates so that the back support plates are superimposed on each other. Accordingly, the plurality of back support plates may be folded using the one or more connection hinges such that they are superimposed on each other, so that an accom-

DESCRIPTION OF IMPORTANT REFERENCE SYMBOLS IN THE DRAWINGS

Figure 1:
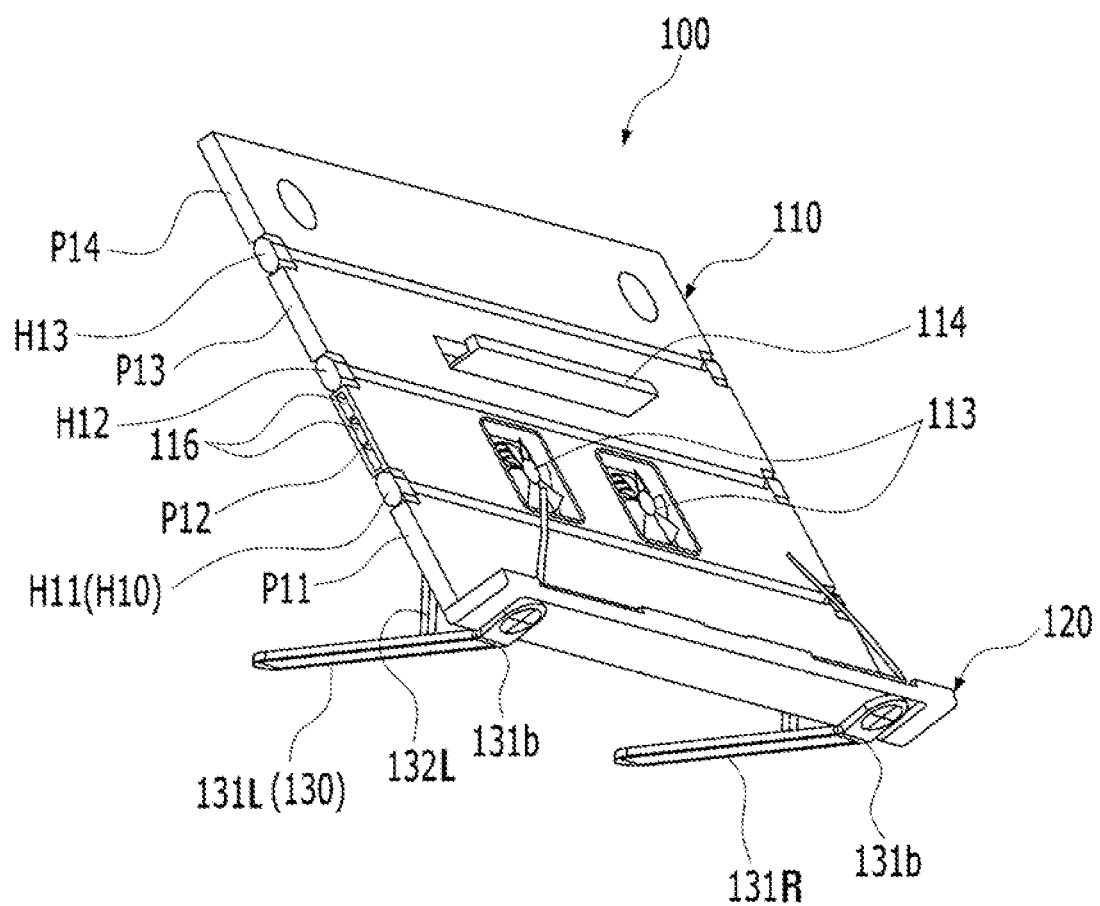
FIG. 1 is a front perspective view schematically showing a foldable holder according to an embodiment of the present invention.

100: foldable holder 110: back surface support part
P10: a plurality of back support plate P11: first back support plate
P12: second back support plate P13: third back support plate
P14: fourth back support plate H10: one or more connection hinge
H11: first connection hinge H12: second connection hinge
H13: third connection hinge 113: cooling fan
114: auxiliary holder 115: external input terminal
116: USB extension adaptor 117: auxiliary battery seat portion
120: lower surface support part 130: bottom support part
131L: left bottom support 131R: right bottom support
131a: a plurality of inclination adjusting groove
132L: left inclination maintaining portion 132R: right inclination maintaining portion

EMBODIMENTS

There is provided a foldable holder including: a back surface support part configured to support the back surface of the object; a lower surface support part fastened to a lower end of the back surface support part, and configured to support a bottom surface of the object; and bottom support parts configured to support the back surface support part on a support surface at a set inclined angle; wherein the back surface support part includes a plurality of back support plates sequentially disposed from the bottom support part, and one or more connection hinges configured to rotatably connect the back support plates so that the back support plates arc superimposed on each other; wherein the plurality of back support plate includes first, second, third, and fourth back support plates sequentially disposed from the bottom support part; wherein the one or more connection hinges include first connection hinges configured to rotatably connect the first and second back support plates, second connection hinges configured to rotatably connect the second and third back support plates, and third connection hinges configured to rotatably connect the third and fourth back support plates; wherein the first, second, third, and fourth back support plates have the same size and shape; wherein the first and second back support plates are folded by the first connection hinges so that the front surfaces thereof come into contact with each other; wherein the second and third back support plates are folded by the second connection hinges so that the back surfaces thereof come into contact with each other; wherein the third and fourth back support plates are folded by the third connection hinges so that the front surfaces thereof come into contact with each other; wherein the left and right bottom supports each have a plate shape, and wherein when the first, second, third, and fourth back support plates are superimposed on each other, the inclination maintaining portions are located on the back surface of the first back support plate, and the left and right bottom supports are pivoted under the lower surface support part.

MODE FOR INVENTION

Embodiments of the present invention will be described in detail below with reference to the accompanying drawings so that those having ordinary skill in the art to which the present invention pertains may easily practice the present invention. However, the present invention may be implemented in various different forms, and is not limited to the embodiments described herein.

Figure 2:
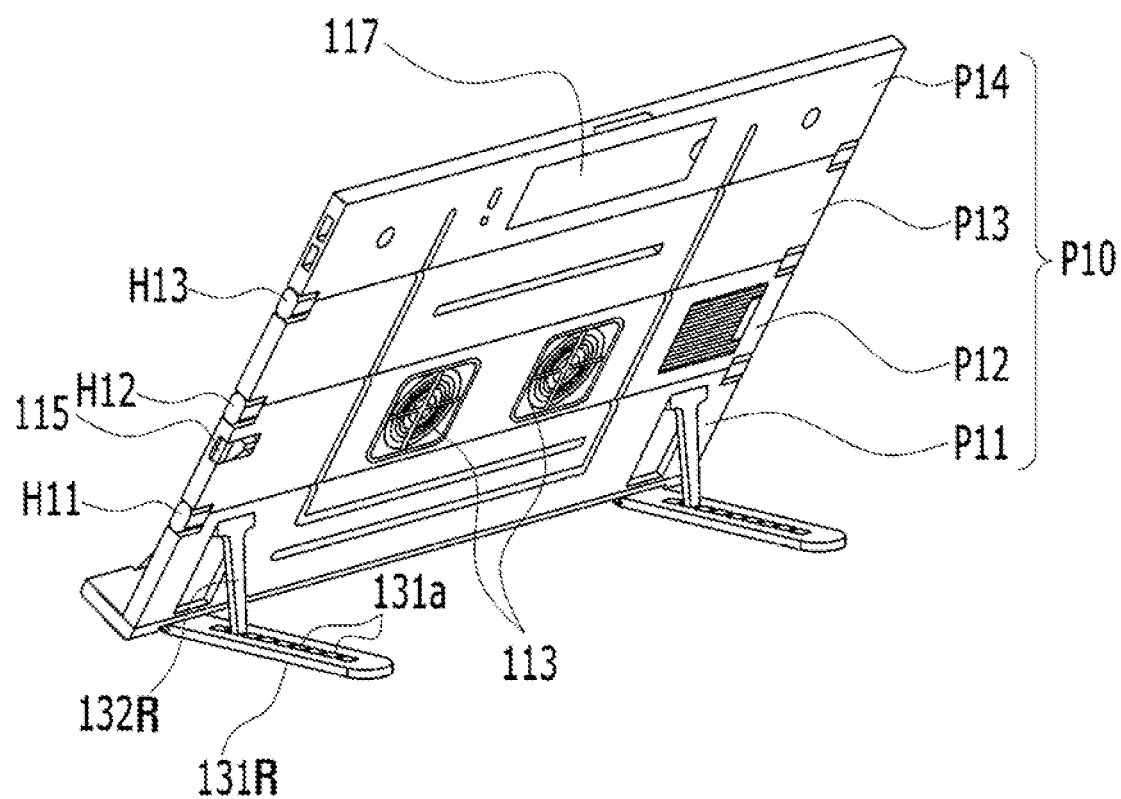
FIG. 2 is a back perspective view showing the foldable holder of FIG. 1 when viewed from the back.
Figure 3:
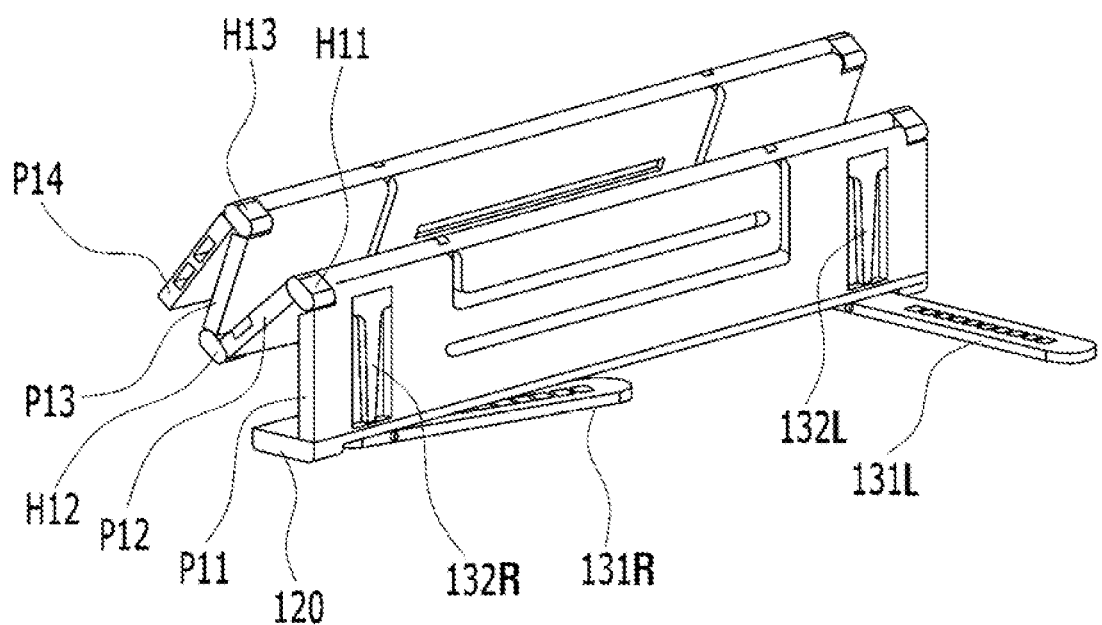
FIG. 3 is a perspective view schematically showing a state in which the foldable holder of FIG. 2 is being folded.
Figure 4:
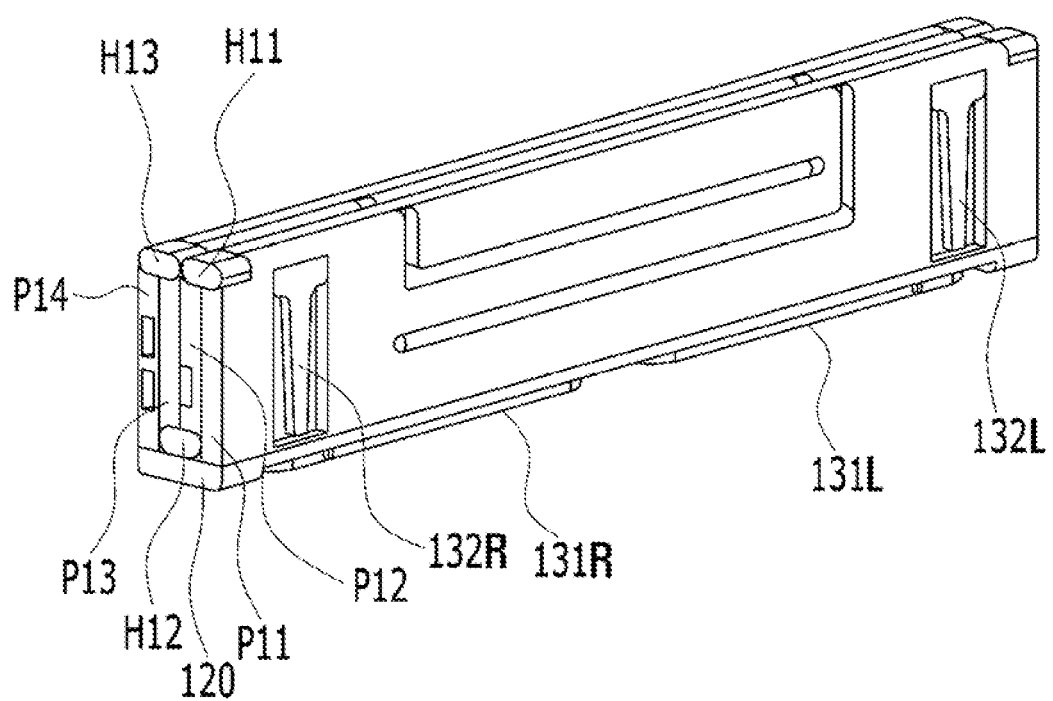
FIG. 4 is a perspective view schematically showing a state in which the foldable holder of FIG. 3 has been completed folded.

FIG. 1 is a front perspective view schematically showing a foldable holder according to an embodiment of the present invention, FIG. 2 is a rear perspective view showing the foldable holder of FIG. 1 when viewed from the back. FIG. 3 is a perspective view schematically showing a state in which the foldable holder of FIG. 2 is folded, and FIG. 4 is a perspective view schematically showing a state in which the foldable holder of FIG. 3 has been completed folded.

As shown in FIGS. 1 to 4, a foldable holder 100 according to an embodiment of the present invention is a foldable holder for supporting an object to be supported, such as a book, a notebook computer, or a tablet PC, and includes a back surface support part 110, a lower surface support part 120, and bottom support parts 130. The individual components will be described in detail below with continuous reference to FIGS. 1 to 4.

The back surface support part 110 is a component that supports the back surface of an object to be supported, such as a book or a notebook computer, on the front side thereof. In particular, the back surface support part 110 may include a plurality of back support plates P10 and one or more connection hinges H10, as shown in FIGS. 1 to 4. In this case, the individual back support plates P10 may be sequentially disposed from the lower surface support part 120, and the one or more connection hinges H10 may rotatably connect the individual back support plates P10 so that the individual back support plates P10 are superimposed on each other.

Accordingly, the plurality of back support plates P10 may be folded to be superimposed on each other by using the one or more connection hinges H10, so that an accommodation space to be occupied in a bag or the like may be significantly reduced, and thus the foldable holder may be easy to carry.

The lower surface support part 120 is a component that supports the bottom surface of an object to be supported, such as a book, a notebook computer or the like, and may be fastened to the lower end of the back surface support part 110, as shown in FIGS. 1 and 2. Furthermore, the lower surface support part 120 may have a plate shape and protrude from the front surface of the first back support plate P11, as shown in FIGS. 1 and 2, so that the bottom surface of the object to be supported is prevented from sliding downward.

The bottom support parts 130 are components that support the back surface support part 110 on the bottom sides thereof at a set inclined angle. For example, one of the bottom support parts 130 may include a left bottom support 131L, and a left inclination maintaining portion 132, and another one of the bottom support parts may Include a right bottom support 131R and a right inclination maintaining portion 132R, as shown in FIGS. 1 to 3. In this case, the left bottom support 131L and the right bottom support 131R are provided on the bottom surface of the lower surface support part 120 to be laterally rotatable and are provided with a plurality of inclination adjusting grooves 131a formed in the longitudinal direction thereof on the top surface thereof, and the left and right inclination maintaining portions 132L, 132R are provided on the back surface of the back surface support part 110 to be vertically rotatable and may be caught on any one of the plurality of inclination adjusting grooves 131a. Accordingly, the back surface support part 110 may be supported on a support surface at the set inclined angle in such a manner that a user laterally rotates the left and the right bottom supports 131L, 131R so that the left and the right bottom supports 131L, 131R are placed in a direction in which the back surface of the back surface support part 110 is oriented and then fit the left and right inclination maintaining portions 132L, 132R into any one of the plurality of inclination adjusting grooves 131a formed on the left and the right bottom supports 131L, 131R.

In addition, the boundary portion 131b of the left and the right bottom supports 131L, 131R with respect to the lower surface support part 120 is made thin, and is thus allowed to be easily bent when inclination is adjusted.

The back surface support part 110 will be described in detail below with continuous reference to FIGS. 1 to 4.

The back surface support part 110 may further include cooling fans 113 and an auxiliary holder 114, as shown in FIGS. 1 and 2.

In this case, the cooling fans 113 may be provided on any one of the plurality of back support plates P10, and the auxiliary holder 114 is provided on another of the plurality of back support plates P10 to be selectively extended and retracted in a front-back direction and may be used to seat a smartphone or tablet PC having a smaller size than a notebook computer.

The plurality of back support plate P10 may include first, second, third, and fourth back support plates P11, P12, P13 and P14 sequentially disposed from the lower surface support part 120, as shown in FIGS. 1 to 4. Furthermore, the one or more connection hinges H10 may include first connection hinges H11 configured to rotatably connect the first and second back support plates P11 and P12, second connection hinges H12 configured to rotatably connect the second and third back support plates P12 and P13, and third connection hinges H13 configured to rotatably connect the third and fourth back support plates P13 and P14, as shown in FIGS. 1 to 4. In this case, as shown in FIG. 1, the cooling fans 113 may be provided on the second back support plate P12, and the auxiliary holder 114 may be provided on the third back support plate P13.

Furthermore, as shown in FIGS. 1 to 4, the back support plates P10 may have the same size and shape.

In particular, as shown in FIGS. 2 to 4, the first and second back support plates P11 and P12 may be superimposed by the first connection hinges H11 so that the front surfaces thereof come into contact with each other, the second and third back support plates P12 and P13 may be superimposed by the second connection hinges H12 so that the back surfaces thereof come into contact with each other, and the third and fourth back support plates P13 and P14 may be superimposed by the third connection hinges H13 so that the front surfaces thereof come into contact with each other.

Furthermore, as shown in FIG. 4, when the first, second, third and fourth back support plates P11, P12. P13 and P14 are superimposed on each other, and the lower surface support part 120 faces an upper end of the fourth back support plate P14.

Moreover, the back surface support part 110 may further include an external input terminal 115, a USB extension adaptor 116, and an auxiliary battery seat portion 117, as shown in FIGS. 1 and 2.

As described above, the foldable holder 100 according to an embodiment of the present invention may have the following effect.

According to the one embodiment of the present invention, the foldable holder includes the back surface support part 110, the lower surface support part 120, and the bottom support parts 130. The back surface support part 110 supports the back surface of an object to be supported, such as a book, a notebook computer or the like, and is configured to include the plurality of back support plates P10 sequentially disposed from the lower surface support part 120 and the one or more connection hinges H10 configured to rotatably connect the back support plates P10 so that the back support plates P10 are superimposed on each other. Accordingly, the plurality of back support plates P10 may be folded using the one or more connection hinges 1110 such that they are superimposed on each other, so that an accommodation space to be occupied in a bag or the like may be significantly reduced, and thus the foldable holder may be easy to carry.

While the preferred embodiments of the present invention have been descried in detail above, the scope of the present invention is not limited thereto, but various alterations and modifications of those skilled in the art using the basic concept of the present invention defined in the following claims fall within the scope of the present invention.

INDUSTRIAL APPLICABILITY

The foldable holder according to the one embodiment of the present invention is provided. The foldable holder includes the back surface support part, the bottom support part, and the bottom support parts. The back surface support part supports the back surface of an object to be supported, such as a book, a notebook computer or the like, and is configured to include the plurality of back support plates sequentially disposed from the lower surface support part and the one or more connection hinges configured to rotatably connect the back support plates so that the back support plates are superimposed on each other. Accordingly, the plurality of back support plates may be folded using the one or more connection hinges such that they arc superimposed on each other, so that an accommodation space to be occupied in a bag or the like may be significantly reduced, and thus an effect is achieved in that that the foldable holder is easy to carry. Therefore, the present invention has high industrial applicability.

What is claimed is:
1. A foldable holder comprising:
a back surface support part (110) which is unfolded when supporting a back surface of an object and folded for storage;
a lower surface support part (120) fastened to a lower end of the back surface support part, and configured to support a bottom surface of the object when the back surface support part (110) is unfolded; and bottom support parts (130) which support the back surface support part (110) on a support surface at an adjustable inclined angle;

wherein the back surface support part (110) comprises:

back support plates (P10) sequentially arranged from the lower surface support part (120) upwardly when the back surface support part (110) is unfolded and the back support plates (P10) are substantially coplanar;

wherein the back support plates (P10) comprise first, second, third, and fourth back support plates (P11, P12, P13, P14); and one or more connection hinges (H10) which rotatably connect the back support plates (P10) so that the back support plates (P10) are superimposed on each other when the back surface support part (110) is folded;

wherein the one or more connection hinges (H10) comprise:

first connection hinges (H11) which rotatably connect the first and second back support plates with each other;

second connection hinges (H12) which rotatably connect the second and third back support plates with each other; and third connection hinges (H13) which rotatably connect the third and fourth back support plates with each other;

wherein the first, second, third, and fourth back support plates (P11, P12, P13, P14) are the same as each other in size and shape;

wherein the first and second back support plates (P11, P12) are folded by the first connection hinges so that front surfaces of the first and second back support plates come into contact with each other;

wherein the second and third back support plates (P12, P13) are folded by the second connection hinges so that back surfaces of the second and third back support plates come into contact with each other;

wherein the third and fourth back support plates (P13, P14) are folded by the third connection hinges so that front surfaces of the third and fourth back support plates come into contact with each other;

wherein the bottom support parts (130) include bottom supports (131) an adjustable inclination maintaining portions (132L, 132R), wherein the bottom supports (131) extend rearwardly from a bottom of the lower surface support part (120) when the back surface support part (110) is configured to support the object; and wherein, when the back surface support part (110) is folded, the first, second, third, and fourth back support plates (P11, P12, P13, P14) are superimposed on each other, and the lower surface support part (120) faces an upper end of the fourth back support plate (P14).

2. The foldable holder of claim 1, wherein the back surface support part (110) further comprises:

a cooling fan provided on any one of the back support plates (P10); and an auxiliary holder provided on another of the back support plates (P10) to be selectively extended and retracted in a front-back direction, and configured to seat a smartphone or tablet PC.

3. The foldable holder of claim 2, wherein the cooling fan is provided on the second back support plate (P12), wherein the auxiliary holder is provided on the third back support plate (P13).

\* \* \* \* \*